United States Patent
Akinori

(10) Patent No.: US 10,429,730 B2
(45) Date of Patent: Oct. 1, 2019

(54) PELLICLE

(71) Applicant: SHIN-ETSU CHEMICAL CO., LTD., Tokyo (JP)

(72) Inventor: Nishimura Akinori, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 15 days.

(21) Appl. No.: 15/596,569

(22) Filed: May 16, 2017

(65) Prior Publication Data

US 2017/0343895 A1  Nov. 30, 2017

(30) Foreign Application Priority Data

May 26, 2016 (JP) .................. 2016-104916

(51) Int. Cl.
*G03F 1/64* (2012.01)
*G03F 7/20* (2006.01)

(52) U.S. Cl.
CPC ............. *G03F 1/64* (2013.01); *G03F 7/2004* (2013.01)

(58) Field of Classification Search
None
See application file for complete search history.

(56) References Cited

U.S. PATENT DOCUMENTS

| 9,740,093 | B2 * | 8/2017 | Sekihara | G03F 1/64 |
| 2009/0029268 | A1 | 1/2009 | Lin et al. | |
| 2011/0104420 | A1 | 5/2011 | Horikoshi | |
| 2011/0236807 | A1 * | 9/2011 | Shirasaki | G03F 1/64 430/5 |

FOREIGN PATENT DOCUMENTS

| EP | 2 306 241 A2 | | 4/2011 | |
| EP | 2 306 241 A3 | | 12/2013 | |
| JP | 06-019124 | * | 1/1994 | ............... G03F 1/14 |
| JP | 10-048811 | * | 2/1998 | ............... G03F 1/14 |
| JP | 11-038598 | * | 2/1999 | ............... G03F 1/14 |
| JP | 2000-227653 | * | 8/2000 | ............... G03G 1/14 |
| JP | 2001-343737 | * | 12/2001 | ............... G03F 1/14 |
| JP | 2003-202660 | * | 7/2003 | ............... G03F 1/14 |
| JP | 2006-163035 | * | 6/2006 | ............... G03F 1/14 |
| JP | 2006-215487 | * | 8/2006 | ............... G03F 1/14 |
| JP | 2008-158116 | * | 7/2008 | ............... G03F 1/14 |
| WO | 2009/008294 A1 | | 1/2009 | |

OTHER PUBLICATIONS

Shin Etsu Silicone, "RTV Rubber", 32 pages (Jul. 2008).*
Search Report dated Sep. 26, 2017, issued in counterpart European Application No. 17168637.1 (6 pages).

* cited by examiner

*Primary Examiner* — Martin J Angebranndt
(74) *Attorney, Agent, or Firm* — Westerman, Hattori, Daniels & Adrian, LLP

(57) ABSTRACT

There is provided a pellicle for lithography which has a unique frame in that it has externally protruding (projecting) portions; to the lower end faces of these protruding portions the photomask-bonding agglutinant layer is applied so as to allow a reduction in the area of the lower end face of the pellicle frame to which conventionally the agglutinant layer was endlessly applied, whereby the pellicle induced deformation to the photomask is mitigated.

5 Claims, 1 Drawing Sheet

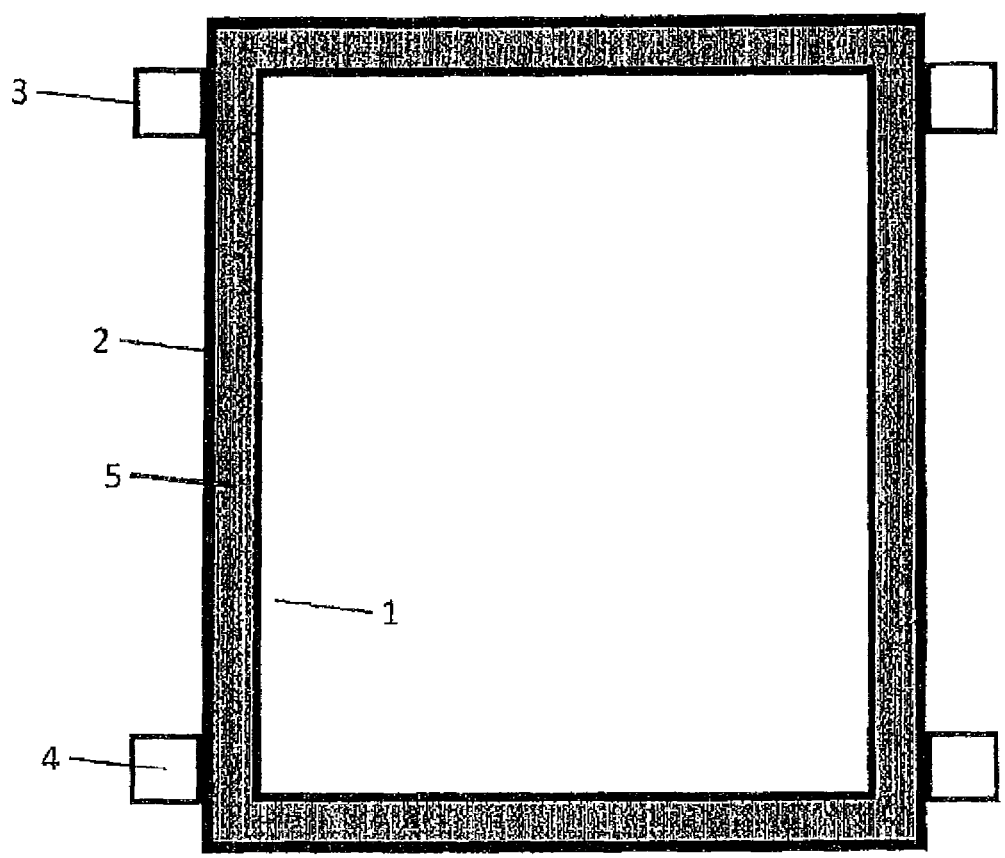

PELLICLE

The present non-provisional patent application claims priority, as per Paris Convention, from Japanese Patent Application No. 2016-104916 filed on May 26, 2016, the disclosure of which is hereby incorporated by reference herein in its entirety.

FIELD OF THE INVENTION

The present invention relates to a pellicle, which is used as a dust fender for a photomask employed in the scenes of manufacturing semiconductor devices, printed circuit board and liquid crystal display panels, etc.

BACKGROUND OF TECHNOLOGY

In the manufacture of semiconductors such as LSI and VLSI and the manufacture of liquid crystal displays and the like, patterns are formed by irradiating light onto a semiconductor wafer or a liquid crystal original plate; however, if dust adheres to the photomask or the reticle (hereinafter simply referred to as a "photomask") used on these occasions, there occurs a problem of impaired dimensions, quality, and appearance, due to roughened edges or black stains on the base.

For this reason, these operations are usually performed in a clean room, but it is still difficult to keep the photomask constantly clean; so light exposure is carried out after attaching the pellicle as a dust fender over the surface of the photomask. In this case, a foreign matter does not directly adhere to the surface of the photomask but adheres to the pellicle; so if the exposure light is focused on the pattern described on the exposure original plate the foreign matter stuck on the pellicle does not partake in the image transferring.

Generally, a pellicle is formed by adhering a transparent pellicle film made of nitrocellulose, cellulose acetate, fluorine-including resin or the like which permits light to pass well to an upper end face of a pellicle frame made of aluminum, stainless steel, polyethylene or the like, said adhesion being effected by first applying a solvent which dilutes the pellicle film well to the upper end face of the pellicle frame, air-drying the solvent and then bonding the pellicle film to it (see IP Publication 1), or in place of the solvent an adhesive such as acrylic resin or epoxy resin is used for the bonding (see IP Publication 2 and IP Publication 3). Further, on the lower end face of the pellicle frame, an agglutinant layer is laid which is made of polybutene resin, polyvinyl acetate resin, acrylic resin, silicone resin or the like for bonding the pellicle to the photomask, and also a releasing layer (separator) for protecting the agglutinant layer is laid over the agglutinant layer.

When such a pellicle is attached to the surface of the photomask, and a photoresist film formed on the semiconductor wafer or the liquid crystal original plate with this photomask is subjected to the exposure light, the foreign particles such as dust material stick only to the surface of the pellicle but not directly to the photomask so that if the focal point is controlled to come on the pattern formed on the photomask, it is possible to avoid the effect of the foreign particles.

Now, semiconductor devices and liquid crystal displays have been increasingly highly integrated and densified in recent years. At present, a technique for forming a fine pattern of about 32 nm on a photoresist film has also been put to practical use. As long as the fine-ness of the pattern is about 32 nm, it is possible to cope with the demand by means of the methods such as the immersion exposure method in which the space between the semiconductor wafer or the liquid crystal original plate and the projection lens is filled with a liquid such as ultrapure water and then the photoresist film is exposed by using an argon fluoride (ArF) excimer laser, or an improved technique which uses a conventional excimer laser to effect multiple exposure.

However, further densified pattern formation is required for next-generation semiconductor devices and liquid crystal displays, and it has proved to be difficult to form such finer patterns by merely using conventional pellicle and exposure technologies.

Therefore, in recent years, as a method for forming a finer pattern, an EUV exposure technique using EUV light having a dominant wavelength of 13.5 nm is in the light.

PRIOR ART PUBLICATIONS

IP Publications

[IP Publication 1]
Japanese Patent Application Publication S58(1983)-219023
[IP Publication 2]
U.S. Pat. No. 4,861,402
[IP Publication 3]
Japanese Pre-Patent Publication for Public Review S63 [1988]-27707

SUMMARY OF THE INVENTION

Problems the Invention Seeks to Solve

As the densification of semiconductor devices and liquid crystal displays progresses, the pellicles increasingly affect the yield of the devices and displays, for, when the pellicle is bonded to the photomask, the stress of the pellicle causes distortion (PID: Pellicle Induced Distortion) of the photomask, and consequently the positional accuracy of the pattern to be formed is degraded, and as a result it becomes difficult to form a densified pattern, and hence a big problem.

In a conventional pellicle, a pressure sensitive agglutinant layer is provided over the entire periphery of the lower end face of the pellicle frame, and when the pellicle and the photomask are bonded together, the photomask receives stress from the entire area of the lower end face of the pellicle frame, and as a result the photomask is distorted by the stress. Depending on the degree of the distortion of the photomask caused by the stress received from the pellicle frame, it becomes difficult to form a required fine pattern.

The present invention has been made to solve the above-described problem, and it is an object of the present invention to reduce the stress transmitted from a pellicle frame to a photomask when the pellicle frame is bonded to the photomask, to thereby suppress the mask distortion.

The inventor of the present invention conducted intensive studies to achieve the above object, and as a result, found that if a sealing material layer made of a soft gel substance is provided on the lower end face of the pellicle frame along its entire circumference, and also if an agglutinant layer is provided partially on the said lower end face at a plurality of sections, then, compared to the conventional manner in which the agglutinant layer is continuously formed all around the pellicle frame, the stress the pellicle transmits to the photomask is mitigated and thus the PID can be made smaller, and thus the inventor possessed the present invention.

Means for Solving the Problem

Thus, the pellicle of the present invention includes an endless pellicle frame having an upper and a lower opposing end faces, a pellicle film bonded to the said upper end face of the pellicle frame in a slack-free manner, a sealing material layer of a gel-like substance laid on the said lower end face of the pellicle frame continuously all around the pellicle frame, and an agglutinant layer laid at locations including a plurality of sections of the said lower end face.

It is preferable that the pellicle of the present invention is such that the pellicle frame is provided with a plurality of outwardly projecting portions (protrusions), and the agglutinant layer is provided also on the lower end faces of these projecting portions, which faces are flush with the lower end face of the pellicle frame main body. In this case, the total area of the agglutinant layer is preferably 1 to 80% of the area of the lower end face of the pellicle frame not including that of the lower end face of the projecting portions.

Further, the gel-like substance used in the present invention is preferably a silicone gel, and its penetration degree is preferably 40 through 150. The agglutinant layer is preferably made of a silicone agglutinant or an acrylic agglutinant.

Effect of the Invention

According to the present invention, the stress applied to the photomask from the pellicle can be relaxed and the PID can be suppressed lower as compared with the conventional practices. Therefore, this invention is more effective when applied to such lithography methods such as EUV where the problem of PID effect is more serious.

BRIEF DESCRIPTION OF THE DRAWINGS

Figure

FIGURE is a schematic view of a pellicle according to the present invention as viewed from the lower end face side of the pellicle frame.

EMBODIMENTS FOR CARRYING OUT THE INVENTION

Hereinafter, one embodiment of the present invention will be described in detail, but the present invention is not limited thereto.

The pellicle of the present invention is particularly effective when it is applied to the use for manufacturing semiconductors where distortion of the photomask is particularly problematic, but it is not limited to its application. The present invention is applicable to all sorts of pellicles which are beset with the problem of pellicle induced photomask deformation: for example, the present invention works well in manufacturing semiconductors having a side of about 150 mm, in manufacturing printed boards with sides of 200 to 300 mm and also in manufacturing liquid crystals and organic EL displays with sides of 500 to 2000 mm.

The pellicle of the present invention is configured to include an endless pellicle frame and a pellicle film stretched over the upper end face of the pellicle frame. As the material of the pellicle frame, known materials can be used such as metals and alloys including aluminum alloys, steel, stainless steel, brass, Invar, Super Invar, or engineering plastics including PE, PA, and PEEK, or fiber composite materials including GFRP, CFRP.

Further, it is preferable that the surface of the pellicle frame is treated to have a black color, and that the surface treatment such as painting for preventing dust generation is applied, if need be. For example, in the case of using an aluminum alloy, surface treatment such as alumite treatment or chemical conversion treatment is preferably performed, and in the case of steel, stainless steel or the like, surface treatment such as black chromium plating is preferably performed.

It is also preferable to apply an adhesive substance such as an acrylic adhesive, a silicone adhesive or the like on the inner surface of the pellicle frame in order to capture and fix floating foreign matters. It is also preferable to form a coating film of a non-tacky resin such as an acrylic resin or a fluorinated resin only on the inner surface or the entire surface of the pellicle frame for the purpose of preventing dust generation. Formation of coating films of these tacky resins and non-tacky resins can be carried out by known methods such as spraying, dipping, powder coating, electrodeposition coating and the like.

In addition, a plurality of jig holes and/or grooves may be provided at a plurality of locations on the outer surface of the pellicle frame for purposes such as handling, and it is also preferable to engrave indications such as model number, serial number, bar code, etc. by mechanical marking or laser marking.

Furthermore, a ventilation hole may be provided through the pellicle frame for adjusting the internal pressure of the enclosure created when the pellicle is bonded on the photomask, and a filter made of a porous thin film such as PTFE may be attached to the outside exit of the ventilation hole so as to prevent the entry of foreign matter. To do so, the filter may be attached directly to the outer surface of the pellicle frame after providing an adhesive layer or the like of an appropriate material. The arrangement of the positions and the number of these ventilation holes and the filter, and the shape thereof can be determined in consideration of required air permeability and the kind of required handling and the like.

The optimum pellicle film, depending on the exposure light source to be used, is to be selected from materials such as cellulose resin and fluorine resin, and also from the viewpoint of transmittance, mechanical strength, etc., it is preferable to select a film thickness from the range of about 0.1 to 10 μm; after fabricating the film it is good to apply an antireflection layer to the film, if need be. In particular, when EUV light is used as the exposure light source, an ultrathin silicon film having a film thickness of 1 μm or less or a graphene film can be used. As the adhesive for adhering the pellicle film onto the upper end face of the pellicle frame in a slack-free manner, known adhesives such as acrylic adhesive, fluorine adhesive, silicone adhesive and the like can be used.

The pellicle of the present invention is characterized in that a sealing material layer made of a gel-like substance is provided endlessly on the entire circumference of the lower end face of the pellicle frame opposed to the upper end face on which the pellicle film is bonded in a slack-free manner, and the agglutinant layer is provided on at least a plurality of sections of the lower end face of the pellicle frame.

The term "gel-like substance" as used herein refers to an elastic material which is particularly soft and is not limited by its composition, structure or the like. More specifically, it is an elastic solid having an elastic modulus of $10^6$ N/mm$^2$ or smaller.

Examples of such gel-like substance include so-called polymer gel and urethane gel and can be freely selected from other like materials; but, in particular, it is preferable to use a silicone gel, for it is excellent in light resistance. The silicone gel is a silicone rubber which is modified to have a reduced crosslinking density, and it is mainly used as a potting material.

Examples of such gel-like substance include: KE-104Gel (65), KE-1051J (A/B), KE-1052 (A/B), KE-110Gel, KE-1056, KE-57 (product names of Shin-Etsu Chemical Co., Ltd.); WACKER SilGel 612, WACKER SilGel 610, SEMICOSIL 911, SEMICOSIL 912, SEMICOSIL 914, SEMICOSIL 915HT, SEMICOSIL 920LT, SEMICOSIL 924, CENUSIL GEL 100 (product names of Wacker Asahikasei Silicone Co., Ltd.); JCR 6107, JCR 6109, JCR 6109 S, JCR 6110, EG-3810, 527, SE 1896 FR EG, EG-3000, EG-3100, CY 52-272, CY 52-276, SE 4430, SE 4440-LP, SE 4445 CV (product names of Toray Dow Corning Co., Ltd.), TSJ 3195-W, TSJ 3185, TSJ 3187, TSJ 3175, TSE 3051, TSE 3051-FR, TSE 3051-L, TSE 3062, TSE 3070 (product names of Momentive Performance Materials, Inc.).

The hardness of this gel-like substance can be evaluated by a penetration test prescribed in JIS K 6249: 2003 (JIS K 2220: 2013, ISO 2137: 2007). Specifically, the depth to which a quarter (¼) cone (total load: 9.38±0.025) enters during a specified time (5±0.1 seconds) is measured, and the obtained value (¹⁄₁₀ mm) is referred to as penetration degree.

The penetration of the gel-like substance used in the present invention is preferably 40 through 150, or more preferably 60 through 120. If the penetration degree is large, the influence on the photomask is small, but if the penetration degree so large as to exceed 150, the sealing material layer becomes too soft and it is difficult to maintain the layer shape. On the other hand, if it is less than 40, it is not preferable because it is too hard and the influence (stress) on the photomask from the pellicle increases. Further, it is preferable to use a two-component silicone gel as the gel-like substance, because the penetration can be adjusted by adjusting the compounding ratio of the curing agent.

In addition, although the gel-like substance may have slight tackiness, if the tackiness is more than slight, it can incur substantially large PID as in a conventional pellicle. It is thought that this is because when the tackiness of the pellicle is not small enough, the tacky pellicle would grab the photomask firmly and as a result the pellicle imparts its deformation more persistently to the photomask.

Note that the term "slight tackiness" as used herein refers to an adhesive strength of a gel-like substance such that, as in the situation in Comparative Example 1 described later, when the lower end face of the pellicle frame is provided only with a layer of said substance, the substance layer fails to be attached to the lower end face for 90 days in this long-term adhesion test. Therefore, this property of slight tackiness is evaluated comparatively, and thus whether or not a gel-like substance has the slight tackiness depends on the size, material, weight, etc. of the pellicle.

The sealing material layer made of a gel-like substance may be fixed on the lower end face of the pellicle frame by means of its self-tackiness, but it is possible to use an adhesive or a solvent to effect the fixing of the sealing material layer, if need be.

In the pellicle of the present invention, an agglutinant layer is intermittently provided at a plurality of places on the lower end face of the pellicle frame. The agglutinant layer may be provided outside or inside of the sealing material layer which is endlessly provided on the lower end face.

Further, as shown in the example of FIGURE, it is preferable that a plurality of projecting portions 3 are provided to the pellicle frame 1 and the agglutinant layer is formed on the projecting portions 3. In this case, the pellicle frame's projecting portions 3 are regarded as a member constituting the pellicle frame 1. Furthermore, if lower end face of the pellicle frame 1 has a sufficient width, it is possible to provide no projecting portions 3 but form the sealing material layer 5 and the agglutinant layer 4 to run in parallel to each other, at least along some distances of the circuit (not shown).

The positions where the agglutinant layer 4 and the projecting portions 3 are provided are not particularly limited, and they may be provided to the longer sides in the vicinity of four corners of the pellicle frame 1 as shown in FIGURE, for example, or only to the short sides, or to both the long side(s) and the short side(s). However, since the four corners of the pellicle frame 1 tend to be a starting point of detachment of the pellicle from the photomask, it is preferable to provide the agglutinant layer 4 and the projecting portions 3 near the four corners of the pellicle frame 1.

In addition, it is necessary to set the areas of the agglutinant layer 4 and the projecting portions 3 such that the resulting adhesion of the pellicle to the photomask would be a long term, reliable kind, and to certify this the adhesive strength of the agglutinant, the weight of the pellicle, among others should be taken into consideration. In other words, as long as the adhesive strength of the adhesive is large, the areas may be small, but if the adhesive strength is small, larger areas are required. On the other hand, if the adhesive strength is too large, the residues of the adhesives upon detachment of the pellicle from the photomask may become a problem, and therefore it is necessary to select an agglutinant material having an appropriate adhesive strength.

In the present invention, by laying the agglutinant layer intermittently on the lower end face of the pellicle frame, the stress imparted to the photomask by the pellicle can be lessened. The smaller the area of the agglutinant layer is, the greater the effect becomes, that is, the smaller PID will be. Therefore, the area of the agglutinant layer may be the same as the area of the lower end face of the pellicle frame excluding the projecting portions, but it would be preferable if the agglutinant area is 1 to 80% of the area of the lower end face of the pellicle frame not including the area of the lower end face of the projecting portions, for thereby the PID can be made smaller; furthermore, it is more preferable that the agglutinant area is 4 to 50% in view of keeping the pellicle stably on the photomask for a long term.

As the material of the agglutinant layer, known materials such as rubber type agglutinants, urethane type agglutinants, acrylic agglutinants, SEBS agglutinants, SEPS agglutinants, silicone agglutinants and the like can be used. In particular, when EUV light is used as the exposure light source, it is preferable to use a silicone agglutinant having excellent light resistance and the like characteristics. Also, an agglutinant which generates only small amount of outgas, which may cause haze is preferable.

In order to secure the stability after attachment to the photomask and further to reduce the influence of the pellicle on the photomask, it is preferable that the flatness of the surface of the agglutinant layer and that of the sealing material layer are 30 µm or less. Further, if necessary, it may be formed have a convex sectional shape.

The thickness of the agglutinant layer and the thickness of the sealing material layer are preferably substantially the same, but so long as the sealing material layer can be adhered to the photomask leak-freely when the pellicle is attached to the photomask, it does not matter if their thicknesses are not identical. However, when forming the agglutinant layer and the sealing material layer, it is preferable from the viewpoint of the production process effectiveness to conduct a flattening treatment upon the agglutinant layer and the sealing material layer at the same time by pressing them upon a quartz substrate or the like; by doing so, the thicknesses of the agglutinant layer and the sealing material layer become nearly identical.

On the faces of the agglutinant layer and the sealing material layer, for the purpose of their protection, it is possible to provide a separator made of a PET film or the like having a thickness of 50-300 μm and coated with a releasable agent on one side. This protective separator may not be used if the pellicle case, pellicle support means or the like are so designed as to effect protection of the layers.

In the present invention, by disposing the agglutinant layer intermittently on the lower end face of the pellicle frame, it is possible to alleviate the stress applied to the photomask by the pellicle; also the distortion of the photomask after pellicle attachment, or PID, is controlled by and related to the total area of the agglutinant layer so that a quantitative evaluation of PID becomes possible. Here, PID is a numerical value (magnitude) of a sum of the maximum distortion amounts in a positive direction and a negative direction measured before and after the pellicle attachment to the photomask by FlatMaster manufactured by Corning Tropel Co., Ltd.

Further, on the lower end surface of the pellicle frame, a sealing material layer made of a gel-like substance is provided endlessly round the entire periphery thereof. This sealing material layer is capable of creating a sealant by contacting with the photomask to prevent entry of foreign matter into the space defined within the pellicle frame. In addition, since the gel-like substance constituting the sealing material layer is very soft as compared with conventional agglutinants and the like, the physical influence on the photomask can be reduced.

EXAMPLES

Hereinafter, the present invention will be specifically described with reference to examples and comparative examples. In the following examples, the pellicle frame is provided with a projecting (protruding) portions, but the present invention is not limited to these examples.

Example 1

Example 1 is a case where the projecting portions 3 are provided as shown in FIGURE, and the agglutinant layer 4 is formed on the portions 3. In this case, the area of the agglutinant layer provided on the projecting portions accounts for 4% of the area of the lower end face of the pellicle frame 1 not including the area of the lower end face of the projecting portions 3.

In Example 1, firstly, a pellicle frame 1 made of Super Invar was prepared; its outer dimension was 149.4 mm×116.6 mm, its inner dimension was 145.4 mm×112.6 mm, its height was 1.7 mm, and it had four projecting portions 3 each projecting from a longer side of the frame 1 and from the vicinity of the respective one of the four corners of the pellicle frame 1; the projecting portions 3 had a dimension of 3.2 mm×3.2 mm and a height of 1.7 mm. Further, a filter hole having a diameter of 1.0 mm was also provided in the middle portion of a shorter side of the pellicle frame 1.

Next, after washing the thus prepared pellicle frame 1 with pure water, a silicone pressure-sensitive adhesive (KE-101 A/B; a product name of Shin-Etsu Chemical Co., Ltd.) was applied to the upper end face of the pellicle frame 1 and the lower end face of the projecting portions 3 of the pellicle frame 1. Further, a silicone gel (KE-1052 A/B; a product name of Shin-Etsu Chemical Co., Ltd.) having a penetration of 65 was applied to the lower end face of a pellicle frame main body 2.

Thereafter, a pellicle film made of monocrystalline silicon supported by a porous layer was affixed to the upper end face of the pellicle frame 1, and the pellicle film extending beyond the outer periphery of the pellicle frame 1 was trimmed off, whereby a pellicle was completed.

The thus manufactured pellicle was coupled with a 150 mm square photomask substrate with the lower end face of the pellicle frame 1 meeting the photomask substrate, and this couple was kept horizontally in the air of a temperature of 80° C. with the pellicle beneath the photomask substrate for 90 days to test the bonding durability (long-term bonding test). The pellicle kept being bonded to the photomask substrate for the 90 days, and eventually the pellicle was found still stuck to the photomask substrate when 120 days had passed since the coupling of the two.

Further, the thus manufactured pellicle was bonded to a 150 mm square photomask substrate under the conditions such that the applied load was 5 kgf and the loading time was 30 seconds. Then the PID was evaluated. The value of PID when the pellicle of Example 1 was bonded on the photomask was 21 nm.

Example 2

In Example 2, a pellicle was completed in the same manner as in Example 1 except that the dimension of the projecting portion 3 of the pellicle frame 1 was changed to 10.2 mm×10.2 mm×1.7 mm (height), and that the area of the agglutinant layer 4 was changed to be 40% of the area of the lower end face of the pellicle frame 1 not including that of the projecting portion 3.

When the thus completed pellicle was evaluated in the same manner as in Example 1, the pellicle stayed attached to the photomask for 90 days in the long-term bonding test and the pellicle did not drop from the photomask even when 120 days had passed since the attaching of the pellicle to the photomask. Also, the PID value as of the time of attaching the pellicle to the photomask was 23 nm.

Example 3

In Example 3, a pellicle was completed in the same manner as in Example 1 except that the dimension of the projecting portion 3 of the pellicle frame 1 was changed to 2.3 mm×2.3 mm×1.7 mm (height), and that the area of the agglutinant layer 4 was changed to be 2% of the area of the lower end face of the pellicle frame 1 not including the area of the projecting portion 3.

When the thus completed pellicle was evaluated in the same manner as in Example 1, the pellicle fell from the photomask on the 76$^{th}$ day in the long-term bonding test, and the PID value as of the time of attaching the pellicle to the photomask was 21 nm. In this Example 3, the pellicle stayed bonded to the photomask until 76$^{th}$ day and this was deemed relatively long and at the same time the PID was relatively small so that it was assumed that the object of the present invention was attained.

Example 4

In Example 4, a pellicle was completed in the same manner as in Example 1 except that the dimension of the projecting portion 3 of the pellicle frame 1 was changed to 12.5 mm×12.5 mm×1.7 mm (height), and that the area of the agglutinant layer 4 was changed to be 60% of the area of the lower end face of the pellicle frame 1 not including that of the projecting portion 3.

When the thus completed pellicle was evaluated in the same manner as in Example 1, the pellicle stayed attached to the photomask for 90 days in the long-term bonding test and the pellicle did not drop from the photomask even when 120 days had passed since the attaching of the pellicle to the photomask. Also, the PID value as of the time of attaching the pellicle to the photomask was 37 nm.

Example 5

In Example 5, a pellicle was completed in the same manner as in Example 1 except that the dimension of the projecting portion 3 of the pellicle frame 1 was changed to 14.5 mm×14.5 mm×1.7 mm (height), and that the area of the agglutinant layer 4 was changed to be 80% of the area of the lower end face of the pellicle frame 1 not including that of the projecting portion 3.

When the thus completed pellicle was evaluated in the same manner as in Example 1, the pellicle stayed attached to the photomask for 90 days in the long-term bonding test and the pellicle did not drop from the photomask even when 120 days had passed since the attaching of the pellicle to the photomask. Also, the PID value as of the time of attaching the pellicle to the photomask was 49 nm.

Example 6

In Example 6, a pellicle was completed in the same manner as in Example 1 except that the dimension of the projecting portion 3 of the pellicle frame 1 was changed to 16.2 mm×16.2 mm×1.7 mm (height), and that the area of the agglutinant layer 4 was changed to be 100% of (that is, equal to) the area of the lower end face of the pellicle frame not including that of the projecting portion 3.

When the thus completed pellicle was evaluated in the same manner as in Example 1, the pellicle, like in the cases of Examples 1, 2, 4 and 5, stayed attached to the photomask for 90 days in the long-term bonding test, although the relative area of the agglutinant layer was outside the range of 1 through 80%, and the pellicle did not drop from the photomask even when 120 days had passed since the attaching of the pellicle to the photomask. Only, the PID value as of the time of attaching the pellicle to the photomask was comparatively large 60 nm; however this was deemed to be acceptable in practice.

Comparative Example 1

Comparative Example 1 represents a commonly used conventional pellicle. Firstly, a pellicle frame made of Super Invar was prepared; its outer dimension was 149.4 mm×116.6 mm, its inner dimension was 145.4 mm×112.6 mm, its height was 1.7 mm. Further, a filter hole having a diameter of 1.0 mm was also provided in the middle portion of a shorter side of the pellicle frame 1.

Next, after washing the thus prepared pellicle frame 1 with pure water, a silicone pressure-sensitive adhesive (KE-101 A/B; a product name of Shin-Etsu Chemical Co., Ltd.) was applied to the entire area of the upper end face as well as lower end face of the pellicle frame.

Thereafter, a pellicle film made of monocrystalline silicon supported by a porous layer was affixed to the upper end face of the pellicle frame 1, and that part of the pellicle film which was extending beyond the outer periphery of the pellicle frame 1 was trimmed off, whereby a pellicle was completed.

When the thus completed pellicle was evaluated in the same manner as in Example 1, the pellicle stayed attached to the photomask for 90 days in the long-term bonding test and the pellicle did not drop from the photomask even when 120 days had passed since the attaching of the pellicle to the photomask. However, since the agglutinant layer is formed all over the lower end face of the pellicle frame, the PID value as of the time of attaching the pellicle to the photomask was as great as 82 nm so that the photomask was under a large stress from the pellicle frame.

Comparative Example 2

Comparative Example 2 is characteristic in that no agglutinant layer was formed on the lower end face of the pellicle frame, while only the sealing material layer of gel-like substance was provided on the said lower end face. Firstly, a pellicle frame made of Super Invar was prepared; its outer dimension was 149.4 mm×116.6 mm, its inner dimension was 145.4 mm×112.6 mm, its height was 1.7 mm. Further, a filter hole having a diameter of 1.0 mm was also provided in the middle portion of a shorter side of the pellicle frame.

Next, after washing the thus prepared pellicle frame with pure water, a silicone pressure-sensitive adhesive (KE-101 A/B; a product name of Shin-Etsu Chemical Co., Ltd.) was applied to the upper end face of the pellicle frame. Further, a silicone gel (KE-1052 A/B; a product name of Shin-Etsu Chemical Co., Ltd.) having a penetration of 65 was applied to the lower end face of a pellicle frame.

Thereafter, a pellicle film made of monocrystalline silicon supported by a porous layer was affixed to the upper end face of the pellicle frame, and that part of the pellicle film which was extending beyond the outer periphery of the pellicle frame was trimmed off, whereby a pellicle was completed.

When the thus completed pellicle was evaluated in the same manner as in Example 1, the pellicle fell from the photomask on the $55^{th}$ day in the long-term bonding test, and the PID value as of the time of attaching the pellicle to the photomask was 22 nm.

In Comparative Example 2, since no agglutinant layer was provided on the lower end face of the pellicle frame and only the sealing material layer made of a gel-like substance was provided thereon, the influence of the stress from the pellicle frame to the photomask was small and the resultant PID could also be kept low; on the other hand, the adhesion period of the pellicle to the photomask was as short as 55 days, which was deemed not practical.

EXPLANATION OF REFERENCE NUMERALS

1: pellicle frame
2: pellicle frame main body
3: pellicle frame's projecting portion
4: agglutinant layer
5: sealing material layer

What is claimed is:
1. A pellicle comprising:
a pellicle frame having an upper and a lower end faces; and
a pellicle film bonded to said upper end face of the pellicle frame in a slack-free manner, wherein a sealing material layer of a gel-like substance is laid on said lower end continuously along the pellicle frame, and said pellicle frame has a plurality of projecting portions outwardly projecting from the pellicle frame and an agglutinant layer is laid on lower end face of said projecting portions.

2. A pellicle as claimed in claim 1 wherein an area of said agglutinant layer accounts for 1 through 80% of an area of said lower end face of the pellicle frame not including the lower end face of said projecting portions of the pellicle frame.

3. A pellicle as claimed in claim 1 wherein said gel-like substance is a silicone gel.

4. A pellicle as claimed in claim 1 wherein said agglutinant layer is made of a silicone agglutinant or an acrylic agglutinant.

5. A pellicle as claimed in claim 1 wherein said gel-like substance has a penetration degree of 40 through 150 by a penetration test prescribed in JIS K 6249: 2003.

* * * * *